(12) United States Patent
Tsai et al.

(10) Patent No.: US 11,973,163 B2
(45) Date of Patent: *Apr. 30, 2024

(54) LIGHT EMITTING DEVICE AND PRODUCTION METHOD AND USE THEREOF

(71) Applicant: TIANJIN SANAN OPTOELECTRONICS CO., LTD., Tianjin (CN)

(72) Inventors: ChingYuan Tsai, Tianjin (CN); Chun-Yi Wu, Tianjin (CN); Fulong Li, Tianjin (CN); Duxiang Wang, Tianjin (CN); Chaoyu Wu, Xiamen (CN); Wenhao Gao, Tianjin (CN); Xiaofeng Liu, Tianjin (CN); Weihuan Li, Tianjin (CN); Liming Shu, Tianjin (CN); Chao Liu, Tianjin (CN)

(73) Assignee: Tianjin Sanan Optoelectronics Co., Ltd., Tianjin (CN)

(*) Notice: Subject to any disclaimer, the term of this patent is extended or adjusted under 35 U.S.C. 154(b) by 0 days.

This patent is subject to a terminal disclaimer.

(21) Appl. No.: 18/157,237

(22) Filed: Jan. 20, 2023

(65) Prior Publication Data

US 2023/0187574 A1    Jun. 15, 2023

Related U.S. Application Data

(63) Continuation of application No. 17/084,223, filed on Oct. 29, 2020, now Pat. No. 11,563,140, which is a
(Continued)

(30) Foreign Application Priority Data

May 2, 2018 (CN) .......................... 201810411333.1

(51) Int. Cl.
*H01L 33/00* (2010.01)
*H01L 33/30* (2010.01)
(Continued)

(52) U.S. Cl.
CPC ...... *H01L 33/0062* (2013.01); *H01L 33/0093* (2020.05); *H01L 33/30* (2013.01);
(Continued)

(58) Field of Classification Search
CPC ..... H01L 33/30; H01L 33/0093; H01L 33/38; H01L 33/0062; H01L 33/14;
(Continued)

(56) References Cited

U.S. PATENT DOCUMENTS 5,300,788 A    4/1994   Fan et al.
6,107,648 A *  8/2000   Shakuda ................ H01L 33/02
                                                            257/190
(Continued)

FOREIGN PATENT DOCUMENTS

JP    H09283798 A    10/1997
JP    2001127343 A    5/2001
TW       480752 B     3/2002

OTHER PUBLICATIONS

International Search Report, PCT/CN2019/076136, dated May 29, 2019.
(Continued)

*Primary Examiner* — Savitri Mulpuri
(74) *Attorney, Agent, or Firm* — Thomas | Horstemeyer, LLP

(57) ABSTRACT

A light emitting device includes an epitaxial structure and first and second electrodes on a side of the epitaxial structure. The epitaxial structure includes a first-type semiconductor layer, an active layer, and a second-type semiconductor layer. The active layer is disposed between the
(Continued)

first-type semiconductor layer and the second-type semiconductor layer. The first electrode is disposed on the epitaxial structure to be electrically connected with the first-type semiconductor layer. The second electrode is disposed on the epitaxial structure to be electrically connected with the second-type semiconductor layer. The second electrode is in ohmic contact with a second-type window sublayer of the second-type semiconductor layer.

19 Claims, 8 Drawing Sheets

Related U.S. Application Data continuation-in-part of application No. PCT/CN2019/076136, filed on Feb. 26, 2019.

(51) Int. Cl.
  *H01L 33/38* (2010.01)
  *H01L 33/40* (2010.01)
(52) U.S. Cl.
  CPC ............ *H01L 33/38* (2013.01); *H01L 33/405* (2013.01); *H01L 2933/0016* (2013.01)
(58) Field of Classification Search
  CPC ....... H01L 33/405; H01L 33/62; H01L 33/44; H01L 2933/0016
  See application file for complete search history.

(56) References Cited

U.S. PATENT DOCUMENTS

| | | | |
|---|---|---|---|
| 6,245,588 B1* | 6/2001 | Abe | H01L 33/0093 |
| | | | 257/E33.07 |
| 6,417,522 B1* | 7/2002 | Wang | H01L 33/30 |
| | | | 257/79 |
| 6,420,199 B1 | 7/2002 | Coman et al. | |
| 6,800,500 B2 | 10/2004 | Coman et al. | |
| 6,869,820 B2 | 3/2005 | Chen | |
| 6,909,536 B1 | 6/2005 | Walker et al. | |
| 8,110,425 B2 | 2/2012 | Yun | |
| 8,685,764 B2 | 4/2014 | Chu et al. | |
| 9,543,484 B1 | 1/2017 | Endo et al. | |
| 2001/0028061 A1* | 10/2001 | Hosoba | H01L 33/30 |
| | | | 257/87 |
| 2002/0145147 A1 | 10/2002 | Chiou et al. | |
| 2007/0045608 A1* | 3/2007 | Wang | H01L 33/02 |
| | | | 257/14 |
| 2011/0062466 A1 | 3/2011 | Tanaka et al. | |
| 2012/0273815 A1 | 11/2012 | Tsai et al. | |
| 2020/0212261 A1* | 7/2020 | Lee | H01L 33/44 |

OTHER PUBLICATIONS

Search Report appended to an Office Action, Chinese Application No. 201980000871.4 by the CNIPA dated Sep. 5, 2022 (6 pages).

\* cited by examiner

LIGHT EMITTING DEVICE AND PRODUCTION METHOD AND USE THEREOF

CROSS-REFERENCE TO RELATED APPLICATION

This application is a continuation application of U.S. patent application Ser. No. 17/084,223, filed on Oct. 29, 2020, which is a bypass continuation-in-part application of International Application No. PCT/CN2019/076136 filed on Feb. 26, 2019, which claims priority of Chinese Patent Application No. 201810411333.1, filed on May 2, 2018. The entire content of each of the international and Chinese patent applications is incorporated herein by reference.

FIELD

The disclosure relates to a light emitting device and a production method and use thereof, and more particularly to a flip-chip light emitting device and a production method and use thereof.

BACKGROUND

Advantages of flip-chip light emitting diodes (LEDs) reside in that wire bonding is not required, that electrodes can be arranged not to block light emission, and that excellent heat dissipation can be achieved. Due to such advantages, light emitting efficiency of these diodes can be enhanced. For instance, FIG. 1 shows a conventional flip-chip LED that is AlGaInP-based, and that includes a transparent substrate 101, a semiconductor structure (normally including a first-type semiconductor layer 111, an active layer 112, and a second-type semiconductor layer 113), and a transparent bonding layer 120 interconnecting the transparent substrate 101 and the semiconductor structure. The flip-chip LED shown in FIG. 1 further includes first-type and second-type ohmic contact electrodes 121, 122 (which may be p-type and n-type) that are disposed on the semiconductor structure opposite to the transparent substrate 101 and on the same side of the semiconductor structure. For packaging the flip-chip LED shown in FIG. 1, die bonding is applied to the electrodes 121, 122 for electrical connection.

CN 101897048 A discloses a thin flip-chip light emitting device that is AlGaInP-based, as well as a production method of such device. Specifically, n-type and p-type electrodes are formed on the same side of a semiconductor structure, and the semiconductor structure with such electrodes is connected to amount by way of metallic bonding. Subsequently, a growth substrate, on which the semiconductor structure is formed, is removed.

Moreover, CN 107681034 A discloses a flip-chip micro LED and a production method thereof. To be exact, n-type and p-type electrodes are formed on a side of a semiconductor structure, and the semiconductor structure with such electrodes is bonded to a support substrate, followed by removing a growth substrate on which the semiconductor structure is formed.

Since the aforesaid two Chinese patents both require the semiconductor structure to be connected to the substrate or amount byway of bonding for subsequently removing the growth substrate, the bonding process might cause the LED to be damaged, hence reducing the production yield.

SUMMARY

Therefore, an object of the disclosure is to provide a light emitting device, a production method thereof, and a light emitting apparatus including such device which can alleviate at least one of the drawbacks of the prior art.

According to a first aspect of the disclosure, the light emitting device includes an epitaxial structure, a first electrode, and a second electrode.

The epitaxial structure includes a first-type semiconductor layer, an active layer, and a second-type semiconductor layer. The second-type semiconductor layer has a second-type cladding sublayer and a second-type window sublayer. The active layer is made from aluminum gallium indium phosphide (AlGaInP) and is disposed on the second-type semiconductor layer. The first-type semiconductor layer is disposed on the active layer opposite to the second-type semiconductor layer.

The first electrode is disposed on an electrode placement side of the epitaxial structure, so that the first electrode is electrically connected with the first-type semiconductor layer.

The second electrode is disposed on the electrode placement side of the epitaxial structure, so that the second electrode is electrically connected with the second-type semiconductor layer. The second electrode is in ohmic contact with the second-type window sublayer.

According to a second aspect of the disclosure, the light emitting apparatus includes at least one light emitting device as described above.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Before describing embodiments of a flip-chip light emitting device and a production method thereof according to the present disclosure in detail, experimental results obtained by the applicant are first described below for better understanding of the present disclosure.

Figure 1:
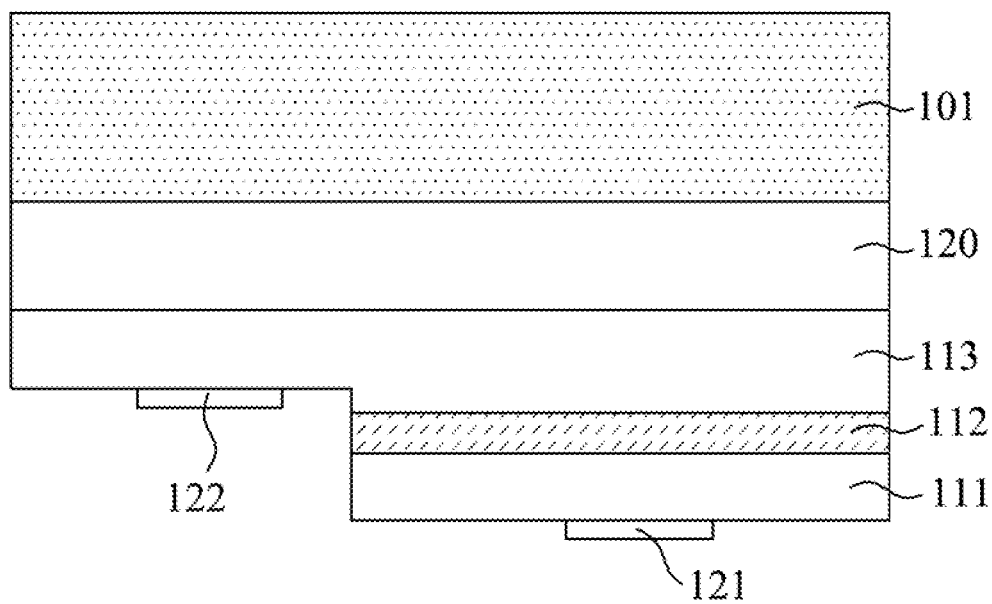
FIG. 1 is a schematic sectional view illustrating a conventional flip-chip light emitting diode.
Figure 2:
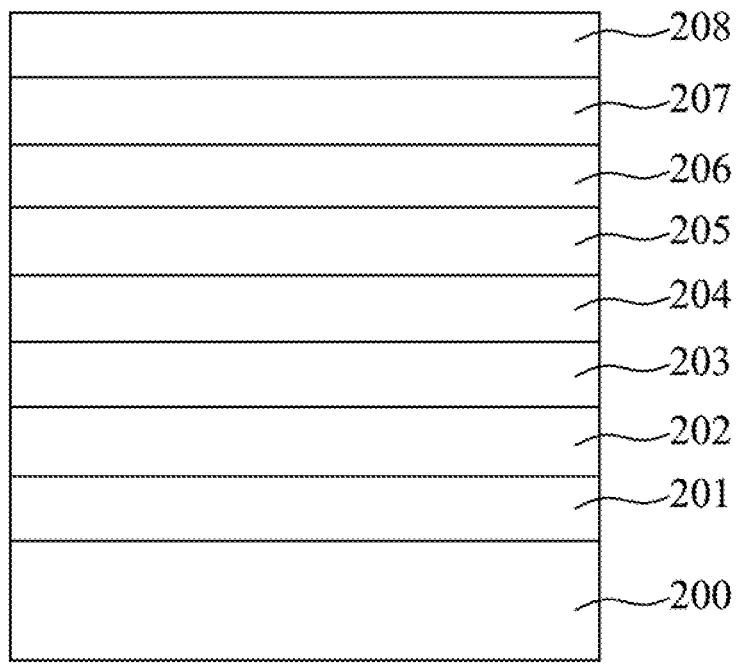
FIG. 2 is a schematic sectional view illustrating an epitaxial structure for a flip-chip light emitting device formed on a growth substrate and including an AlGaInP-based current spreading layer.

Specifically, since a current spreading layer on a n-type or p-type semiconductor layer of an epitaxial structure (i.e. a semiconductor structure) for a flip-chip light emitting device greatly influences the light emitting efficiency and production yield of such epitaxial structure, the applicant prepared two epitaxial structures respectively including aluminum gallium indium phosphide (AlGaInP)-based and aluminum gallium arsenide (AlGaAs)-based current spreading layers, and conducted preliminary experiments thereon. Referring to FIG. 2, an epitaxial structure for a flip-chip light emitting device was epitaxially grown on a growth substrate 200, and had an AlGaInP-based light emitting component. The epitaxial structure included a buffer layer 201, an etch stop layer 202, a contact layer 203, an $(Al_{0.6}Ga_{0.4})_{0.5}In_{0.5}P$ (AlGaInP-based) current spreading layer 204, an n-type layer 205, a multiple-quantum-well (MQW) active layer 206, a p-type layer 207, and a window layer 208, which were arranged on the growth substrate 200 in such sequential order. However, during the epitaxial growth of the AlGaInP-based current spreading layer 204, the temperature window was in a narrow range ($\pm 10°$ C.). In addition, due to the limitation to the incorporation efficiency of In, the growth rate became sensitive to the temperature. Thus, the growth rate, when reaching 7 Å/s, was at the limit, rendering the crystal growth hardly controllable.

Figure 3:
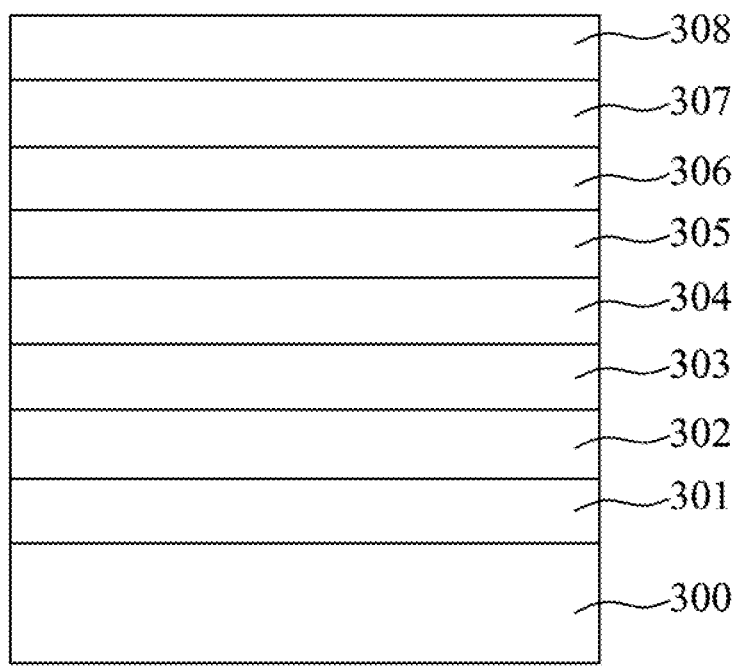
FIG. 3 is a schematic sectional view illustrating an epitaxial structure for a flip-chip light emitting device formed on a growth substrate and including an AlGaAs-based current spreading layer.

Referring to FIG. 3, an epitaxial structure for a flip-chip light emitting device was epitaxially grown on a growth substrate 300 through metal organic chemical vapor deposition (MOCVD), and had an AlGaInP-based light emitting component. The epitaxial structure included a n-GaAs buffer layer 301 (having a thickness of 0.2 µm), a GaInP etch stop layer 302 (having a thickness of 0.2 µm), an n-GaAs contact layer 303 (having a thickness of 70 nm), an $Al_{0.45}Ga_{0.55}As$ (AlGaAs-based) current spreading layer 304 (having a thickness of 3 µm), an n-AlInP n-type layer 305 (having a thickness of 0.3 µm), an MQW active layer 306 (having a thickness of 0.2 µm and generally made from $(Al_{0.5}Ga_{0.5})_{0.5}In_{0.5}P$), a p-AlInP p-type layer 307 (having a thickness of 0.3 µm), and a p-GaP window layer 308 (having a thickness of 1.2 µm), which were arranged on the growth substrate 300 in such sequential order. The wells and barriers of the MQW active layer 306 were made from $(Al_yGa_{1-y})_zIn_{1-z}P$, where each of y and z is larger than 0 and smaller than 1. By adjusting the ratio of y to z, the epitaxial structure could be designed to emit light having a wavelength of 560 nm to 650 nm (i.e. green light, yellow light, orange light, or red light). Specifically, the wells and barriers were made from $(Al_{0.1}Ga_{0.9})_{0.5}In_{0.5}P$ and $(Al_{0.65}Ga_{0.35})_{0.5}In_{0.5}P$, respectively, such that the epitaxial structure could emit light having a wavelength of 620 nm to 624 nm (i.e. red light). The n-AlInP n-type layer 305 and the p-AlInP p-type layer 307 provided electrons and holes, respectively. The window layer 308 served to spread electric currents on the p-type layer 307. The growth temperature of the $Al_{0.45}Ga_{0.45}As$ current spreading layer 304 ranged from 650° C. to 710° C., and the growth time of such layer was 25 minutes. The metal-organic (MO) sources for the growth of the $Al_{0.45}Ga_{0.45}As$ current spreading layer 304 were trimethyl aluminum (TMAl), trimethyl gallium (TMGa), and $AsH_3$.

The epitaxial structure with the AlGaAs-based $(Al_{0.45}Ga_{0.45}As)$ current spreading layer 304 shown in FIG. 3 had the following advantages over the epitaxial structure with the AlGaInP-based $((Al_{0.6}Ga_{0.4})_{0.5}In_{0.5}P)$ current spreading layer 204 shown in FIG. 2. The temperature window for the growth of the $Al_{0.45}Ga_{0.45}As$ current spreading layer 304 was 680±30° C. Compared to the $(Al_{0.6}Ga_{0.4})_{0.5}In_{0.5}P$ current spreading layer 204 having the same thickness, the growth time for the $Al_{0.45}Ga_{0.45}As$ current spreading layer 304 was shortened to 25 minutes, thereby reducing the time for epitaxially growing the epitaxial structure by about 30%. During the epitaxial growth by MOCVD, the amount of $PH_3$ consumption was greatly reduced, hence improving the safety and lowering the production cost. If the epitaxial growth by MOCVD could employ a source more efficiently providing As, the production cost could be further lowered.

Further, the applicant used the epitaxial structure with the AlGaAs-based $(Al_{0.45}Ga_{0.45}As)$ current spreading layer 304 shown in FIG. 3 to produce a flip-chip red-light emitting device (not shown in the drawings) using the following steps. A transparent dielectric layer was disposed on the window layer 308 opposite to the p-type layer 307, and a mirror layer was formed on the transparent dielectric layer opposite to the window layer 308 through deposition, so as to form a total reflection unit. A metallic bonding layer was formed on the mirror layer opposite to the dielectric layer through deposition. A permanent substrate was provided and was disposed on the metallic bonding layer opposite to the mirror layer, followed by conducting a high-temperature and high-pressure bonding process to bond the epitaxial structure to the permanent substrate. Subsequently, the growth substrate 300, the buffer layer 301, and the etch stop layer 302 were removed through thinning and chemical etching to expose the contact layer 303. A first electrode was formed on the exposed contact layer 303, and then a part of the exposed contact layer 303 where the first electrode was not formed was subjected to etching to expose the current spreading layer 304. The exposed current spreading layer 304 was roughened to form a light exit surface. A back electrode was formed on the permanent substrate opposite to the mirror layer, such that the flip-chip red-light emitting device was obtained.

The mirror layer may be made from a monolayer of gold or a gold-containing alloy, or a multilayer of mirror material. The permanent substrate may be made from a common substrate material such as silicon, silicon nitride, etc. The first electrode and the back electrode may be made from a common metallic material such as gold, platinum, nickel, chromium, germanium, and alloys thereof.

The flip-chip red-light emitting device was subjected to an anti-electrostatic discharge (anti-ESD) test. It was found that the anti-ESD4000V performance of the flip-chip red-light emitting device was 25% better that of a flip-chip light emitting device produced in a similar manner but using the epitaxial structure with the AlGaInP-based current spreading layer 204 shown in FIG. 2, indicating that such improved device can satisfy the performance requirement at high voltage.

In addition, the applicant produced another flip-chip light emitting device (not shown in the drawings) using steps generally similar to those described above for producing the flip-chip red-light emitting device, except that the AlGaAs-based current spreading layer applied was a $Al_xGa_{1-x}As$ current spreading layer, where x is larger than 0 and less than 1. To be specific, x is a value not less than 0.45 and not greater than 0.65, such as 0.55. If x is greater than 0.65, the current spreading layer might undesirably increase voltage to higher than 0.23V which is out of a suitable voltage range for a regular light emitting device. The flip-chip light emitting device thus produced was tested and had anti-ESD performance which was 23% better that of the flip-chip light emitting device produced in a similar manner but using the epitaxial structure with the AlGaInP-based current spreading layer 204 shown in FIG. 2.

Lastly, the applicant prepared an epitaxial structure (not shown in the drawings) using steps generally similar to those described above for producing the epitaxial structure shown in FIG. 3, except that the current spreading layer applied was an n-type doped current spreading layer. The doping concentration ranged from $1 \times 10^{18}$ to $2 \times 10^{18}$. To be exact, the doping concentration was 1.5×10^18. During the epitaxial growth, the current spreading layer was subjected to doping with a silicon source. The doping concentration could be controlled by adjusting the flow rate of the silicon source. By virtue of n-type doping, contact resistance between the current spreading layer and the n-type layer or the MQW active layer could be reduced, such that the epitaxial structure could be prevented from overheating and power consumption.

Based on the aforesaid experimental results, the applicant conceived the flip-chip light emitting device and the production method thereof according to the present disclosure, which are now described.

Before the disclosure is described, it should be noted that where considered appropriate, reference numerals or terminal portions of reference numerals have been repeated among the figures to indicate corresponding or analogous elements, which may optionally have similar characteristics.

Figure 4:
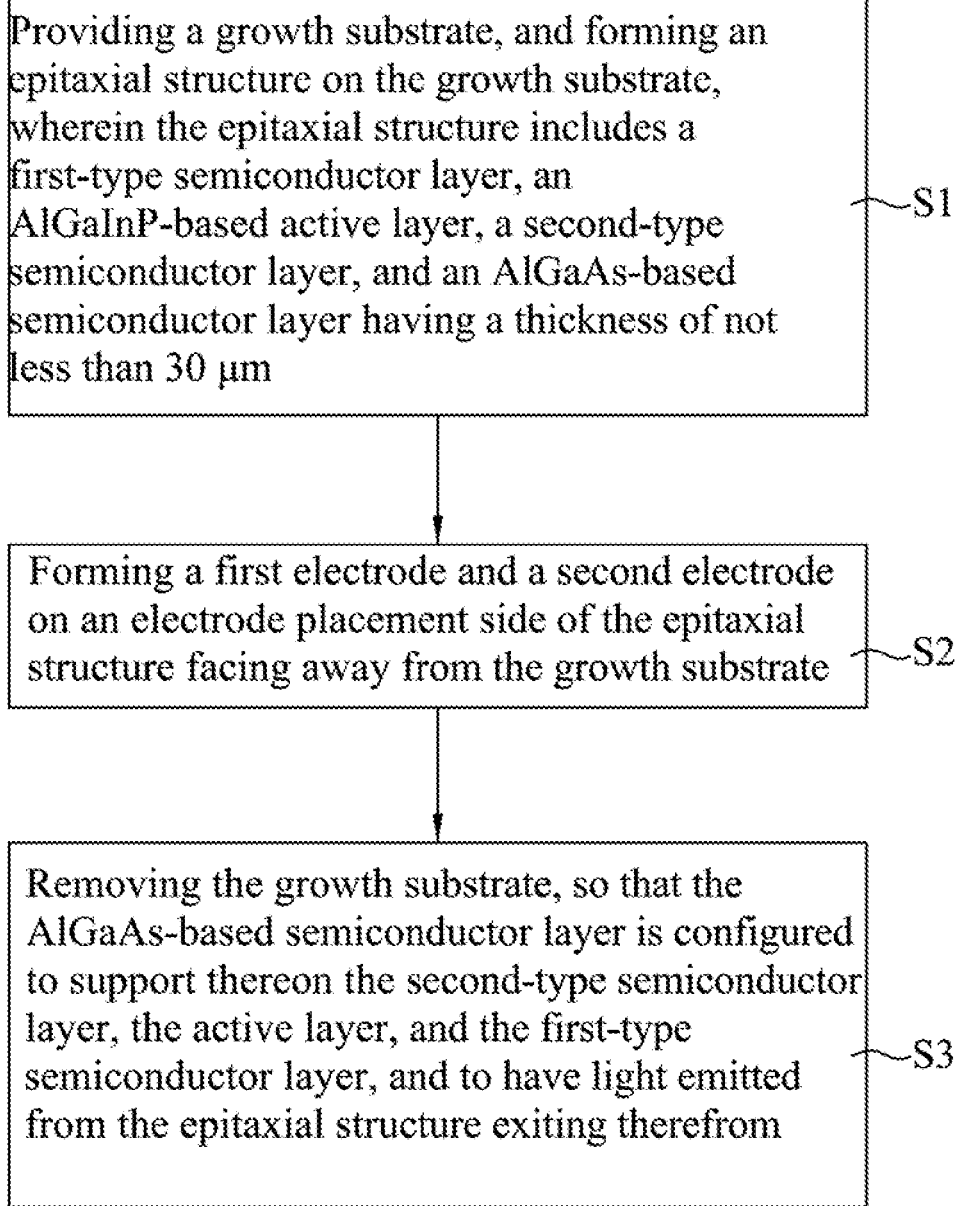
FIG. 4 is a flow chart showing steps S1 to S3 of a first embodiment of a method for producing a flip-chip light emitting device according to the present disclosure.
Figure 5:
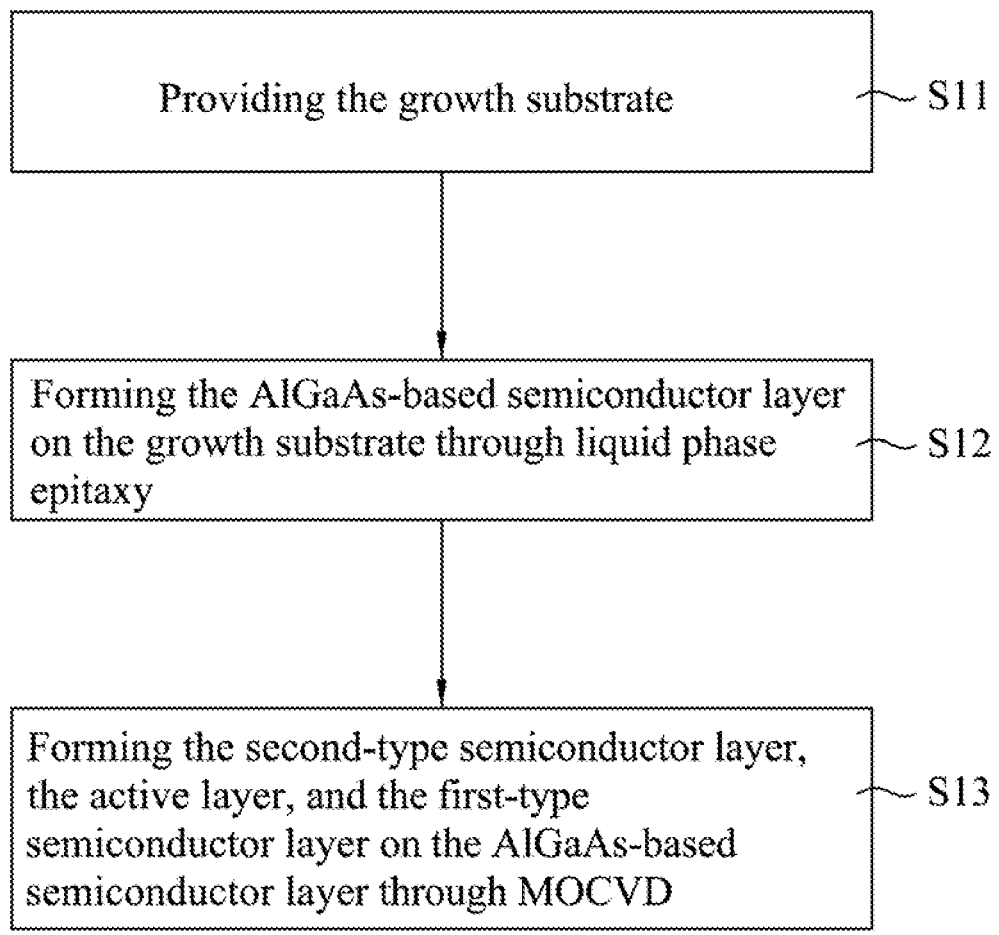
FIG. 5 is a flow chart showing substeps S11 to S13 of step S1 of the first embodiment of the method.

Referring to FIG. 4, a first embodiment of the production method according to the present disclosure includes steps S1 to S3. Referring to FIG. 5, step S1 includes substeps S11 to S13.

Figure 6:
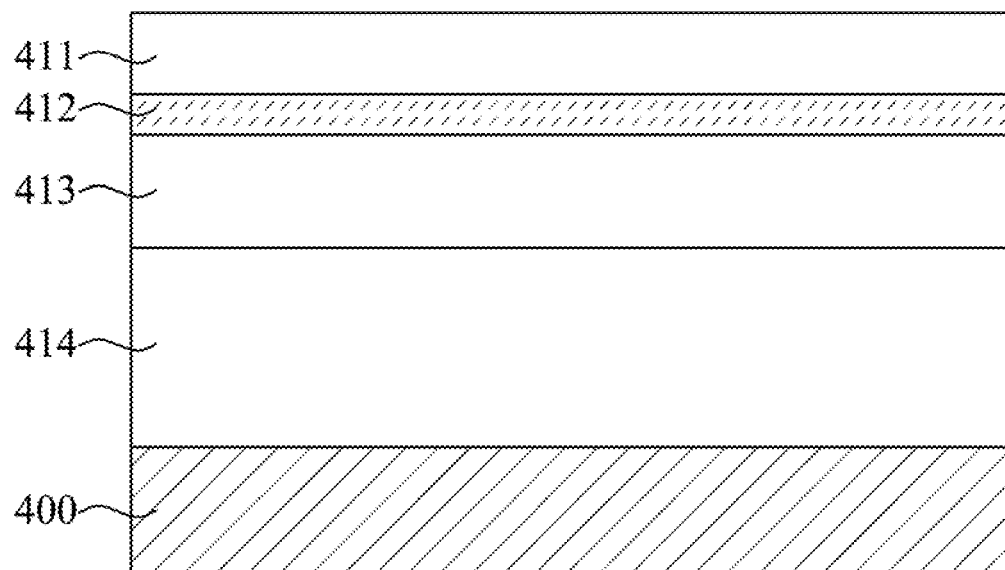
FIGS. 6 to 11 are schematic sectional views illustrating steps S1 to S3 of the first embodiment of the method.

In step S1, as illustrated in FIG. 6, a growth substrate 400 is provided (in substep S11), and an epitaxial structure is formed on the growth substrate 400. The epitaxial structure includes a first-type semiconductor layer 411, a MQW active layer 412, a second-type semiconductor layer 413, and an AlGaAs-based semiconductor layer 414. The AlGaAs-based semiconductor layer 414 is formed on the growth substrate 400 and has a thickness of not less than 30 μm (for instance, 30 μm to 300 μm, particularly, 30 μm to 50 μm, 50 μm to 100 μm, 100 μm to 150 μm, 150 μm to 300 μm, or other range therewithin). The second-type semiconductor layer 413 is formed on the AlGaAs-based semiconductor layer 414 opposite to the growth substrate 400. The active layer 412 is made from aluminum gallium indium phosphide (AlGaInP) and formed on the second-type semiconductor layer 413 opposite to the AlGaAs-based semiconductor layer 414. The first-type semiconductor layer 411 is formed on the active layer 412 opposite to the second-type semiconductor layer 413.

The term "first-type" refers to being doped with a first conductivity type dopant, and the term "second-type" refers to being doped with a second conductivity type dopant that is opposite in conductivity type to the first conductivity type dopant. For instance, the first conductivity type dopant may be a p-type dopant, and the second conductivity type dopant may be an n-type dopant, and vice versa.

The growth substrate 400 may be made from gallium arsenide (GaAs) or any other suitable material.

In substep S12, the AlGaAs-based semiconductor layer 414 is formed through liquid phase epitaxy. The thickness of the AlGaAs-based semiconductor layer 414 in this embodiment ranges from 50 μm to 220 μm. The AlGaAs-based semiconductor layer 414 may have a content of aluminum which ranges from 20 mol % to 95 mol % based on a total molar content of AlGaAs. For instance, the content of aluminum may be 30 mol % to 70 mol % based on the total molar content of AlGaAs. The content of aluminum depends on a desired wavelength of light emitted from the flip-chip light emitting device produced by the method.

In substep S13, the second-type semiconductor layer 413, the active layer 412, and the first-type semiconductor layer 411 are formed through MOCVD.

In this embodiment, the first-type semiconductor layer 411 is a p-type semiconductor layer and has sublayers shown in Table 1 below, and the second-type semiconductor layer 413 is an n-type semiconductor layer and has sublayers shown in Table 1. It should be noted that the sublayer(s) illustrated in Table 1 may be dispensed with in other embodiments, and/or additional sublayer(s) may be provided in other embodiments. For example, the n-type window sublayer illustrated in Table 1 may be dispensed with, and/or an n-type barrier sublayer, a p-type barrier sublayer, an AlGaInP-based transition sublayer, and so forth may be additionally provided.

Table 1 also shows the material, thickness, and function regarding the layers and their sublayers (if any) of the epitaxial structure and the growth substrate 400. From the top row to the bottom row of Table 1, the layers and their sublayers (if any) of the epitaxial structure are listed in a distal-to-proximal manner toward the growth substrate 400.

| | | Material | Thickness (nm) | Function |
|---|---|---|---|---|
| First-type semiconductor layer 411 | p-type window sublayer | GaP | 500 to 5000 | Current spreading and ohmic contact |
| | p-type transition sublayer | AlGaInP | 3 to 100 | Serving as a gradient interface between AlInP and GaP, and enhancing crystal lattice quality of GaP |
| | p-type cladding sublayer | AlInP + Mg | 50 to 5000 | Providing holes |
| | p-type barrier sublayer (or spacer layer) | AlInP/ AlGaInP | 0* to 1000 | Blocking entry of Mg into the active layer 412 to secure performance |
| MQW active layer 412 | N/A | AlGaInP | 10 to 20 per barrier-well pair (a total of 2 to 50 barrier-well pairs) | Serving to determine the wavelength of light emitted and luminance |
| Second-type semiconductor layer 413 | n-type barrier sublayer (or spacer sublayer) | AlInP/ AlGaInP | 0* to 1000 | Blocking entry of Si into the active layer 412 to secure performance |
| | n-type cladding sublayer | AlInP + Si | 50 to 5000 | Providing electrons |
| | n-type window sublayer | Al_cGa_{1-c}InP | 0* to 6000 | Current spreading |
| | n-type ohmic contact sublayer | GaAs | 5 to 20 | Ohmic contact |
| AlGaAs-based semiconductor layer 414 | N/A | AlGaAs | 50,000 to 220,000 | Supporting the layers of the epitaxial structure thereabove, and serving as a light exiting layer |
| Growth substrate 400 | N/A | GaAs | Easily determinable in the art | Growth of the epitaxial structure |

*a thickness of 0 means that the sublayer may be optional.

Regarding the AlGaAs-based semiconductor layer 414, since the crystal lattice of the material thereof (AlGaAs)

almost completely matches with that of the material (GaAs) of the n-type ohmic contact sublayer of the second-type semiconductor layer 413, liquid phase epitaxy can be conducted for rapid epitaxial growth. Furthermore, the AlGaAs material does not absorb light, such that the AlGaAs-based semiconductor layer 414 can serve as a light exiting layer.

The n-type ohmic contact sublayer of the second-type semiconductor layer 413 is to be in ohmic contact with an electrode as described later. Since the n-type ohmic contact sublayer is made from GaAs, light absorption can be reduced. The n-type ohmic contact sublayer may have a thickness of smaller than 50 nm, for example, a thickness ranging from 5 to 20 nm. In other embodiments, the n-type ohmic contact sublayer may be made from other material, such as AlGaAs or AlGaInP.

The n-type window sublayer of the second-type semiconductor layer 413 is formed on the n-type ohmic contact sublayer of the second-type semiconductor layer 413 mainly for current spreading. Regarding the n-type window sublayer, its current spreading ability is correlated with its thickness (the larger its thickness, the better its current spreading ability). Therefore, the thickness of the n-type window sublayer can be adjusted based on the thickness of a flip-chip light emitting device to be produced, and may be smaller than 5000 nm. For example, since a flip-chip light emitting device having a length of not greater than 100 μm normally does not require additional current spreading, the thickness of the n-type window sublayer may be 0 (namely, the n-type window sublayer may be dispensed with) in such case. For another example, when a flip-chip light emitting device having a thickness of not smaller than 300 μm is to be produced, the thickness of the n-type window sublayer may range from 500 nm to 5000 nm.

The active layer 412 is the light emitting layer of the epitaxial structure, which determines the wavelength of light emitted and luminance. In this embodiment, the barriers and wells of the active layer 412 are respectively made from $Al_{a1}Ga_{1-a1}InP$ and $Al_{a2}Ga_{1-a2}InP$, where a1 is larger than a2.

The materials for the n-type cladding sublayer of the second-type semiconductor layer 413 and the p-type cladding sublayer of the first-type semiconductor layer 411 are selected based on the band gap of the active layer 412. For instance, when the active layer 412 is designed to emit light having a wavelength of not less than 670 nm and hence to have a lower band gap, the cladding sublayers may be made from AlGaAs or AlGaInP. For another instance, when the active layer 412 is designed to emit light having a wavelength of lower than 670 nm (particularly not greater than 640 nm) and hence to have a larger band gap (of normally not less than 1.9 eV), the cladding sublayers should be made from a material having a sufficiently large band gap which is normally $Al_bIn_{1-b}P$ (where b is larger than 0 and not greater than 0.5). Concerning the active layer 412 which is made from an AlGaInP-based material, the matched material having the largest band gap is $Al_{0.0}In_{0.5}P$. Accordingly, in this embodiment, the n-type cladding sublayer of the second-type semiconductor layer 413 and the p-type cladding sublayer of the first-type semiconductor layer 411 both may be made from $Al_{0.5}In_{0.5}P$, so that the band gap between the active layer 412 and the p-type cladding sublayer of the first-type semiconductor layer 411 can be maximized.

Undoped AlInP or AlGaInP sublayers may be respectively formed on two opposite sides of the active layer 412. By not introducing a dopant into these sublayers, diffusion of the p-type and n-type dopants from the first-type and second-type semiconductor layers 411, 413 into the active layer 412 can be prevented, thus securing the performance of the active layer 412.

The p-type window sublayer of the first-type semiconductor layer 411 is formed on the p-type cladding sublayer of first-type semiconductor layer 411 for current spreading. In this embodiment, the p-type window sublayer may be made from a GaP material and have a thickness of 1.2 μm. However, since the GaP material of the p-type window sublayer and the AlInP material of the p-type cladding sublayer are quite different in lattice constant, an AlGaInP-based transition sublayer is sandwiched between the p-type cladding sublayer and the p-type window sublayer, serving as a gradient interface between these two sublayers and enhancing the crystal lattice quality of the p-type window sublayer.

The layers of the epitaxial structure shown in Table 1 are more suitable for a flip-chip light emitting device including an epitaxial structure which is designed to have a size of not smaller than 100 μm×100 μm, in particular a size of not smaller than 300 μm×300 μm.

Figure 7:
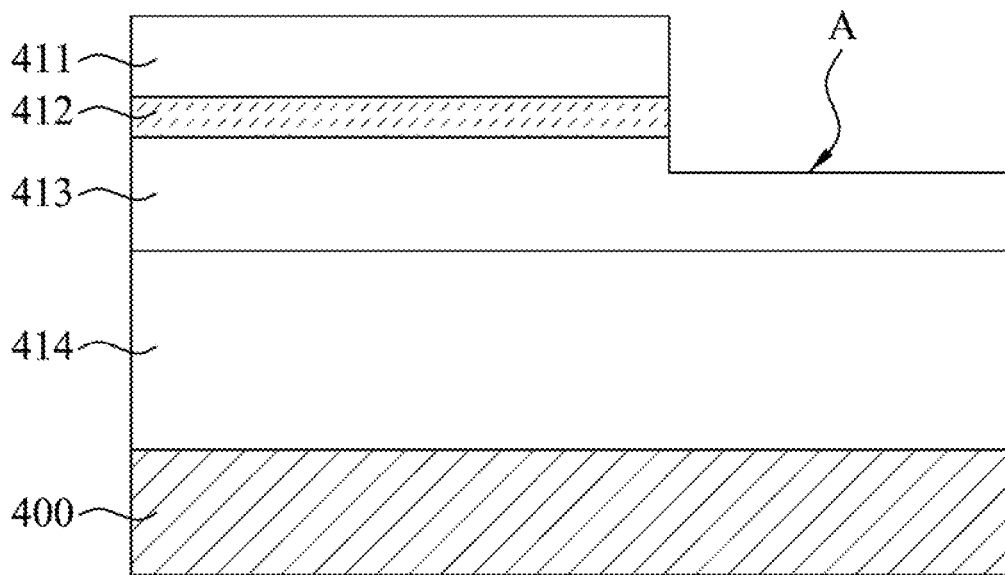
Figure 8:
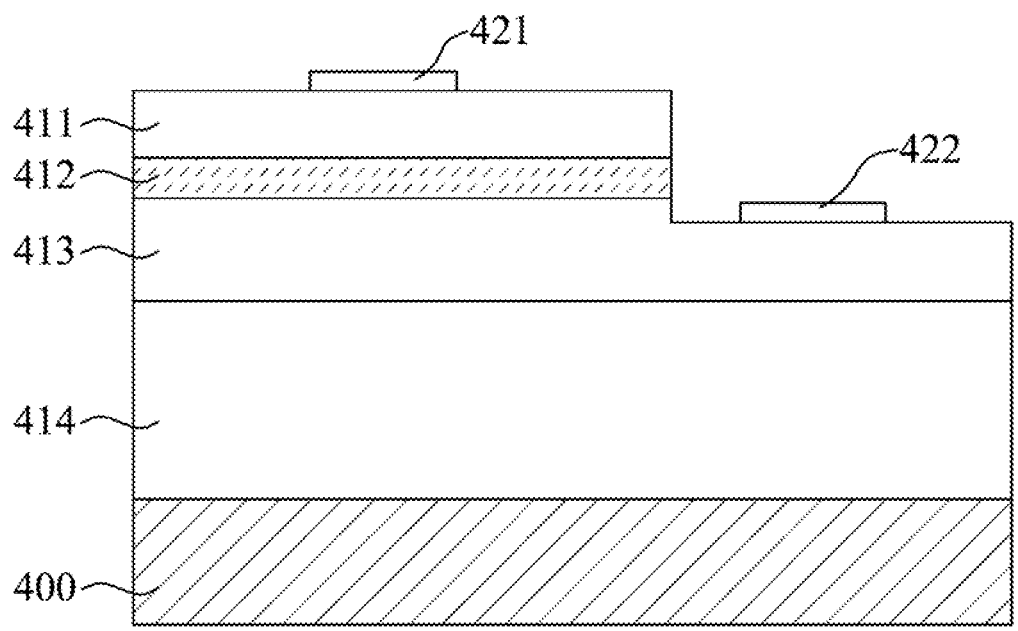

In step S2 (illustrated in FIGS. 7 to 10), a first electrode 421 and a second electrode 422 are formed on an electrode placement side of the epitaxial structure facing away from the growth substrate 400, so that the first and second electrodes 421, 422 are electrically connected with the first-type and second-type semiconductor layers 411, 413, respectively (see FIG. 8). In this embodiment, the first and second electrodes 421, 422 are p-type and n-type electrodes, respectively. Step S2 is further described in detail below.

First of all, as shown in FIG. 7, the first-type semiconductor layer 411, the active layer 412, and the second-type semiconductor layer 413 are partially etched, so that the second-type semiconductor layer 413 is partially exposed to have an exposed surface A. More specifically, the p-type window sublayer, the p-type transition sublayer, the p-type cladding sublayer, the p-type barrier sublayer, the active layer 412, the n-type barrier sublayer, the n-type cladding sublayer, and the n-type window sublayer shown in Table 1 are partially etched, until the n-type ohmic contact sublayer shown in Table 1 is partially exposed to have the exposed surface A. Dry etching may be conducted until the n-type window sublayer is partially exposed to have an exposed portion, and wet etching may be subsequently conducted to remove the exposed portion of the n-type window sublayer to partially expose the n-type ohmic contact sublayer. The exposed surface A of the n-type ohmic contact sublayer is to be in ohmic contact with the second electrode 422.

Afterward, as shown in FIG. 8, the first electrode 421 is formed on a remaining portion of the p-type window sublayer of the first-type semiconductor layer 411, and the second electrode 422 is formed on the exposed surface A of the n-type ohmic contact sublayer of the second-type semiconductor layer 413. The first and second electrodes 421, 422 may be made from an Au/AuZn/Au material. In this embodiment, the first and second electrodes 421, 422 are subjected to annealing so as to be in ohmic contact with the epitaxial structure.

Figure 9:
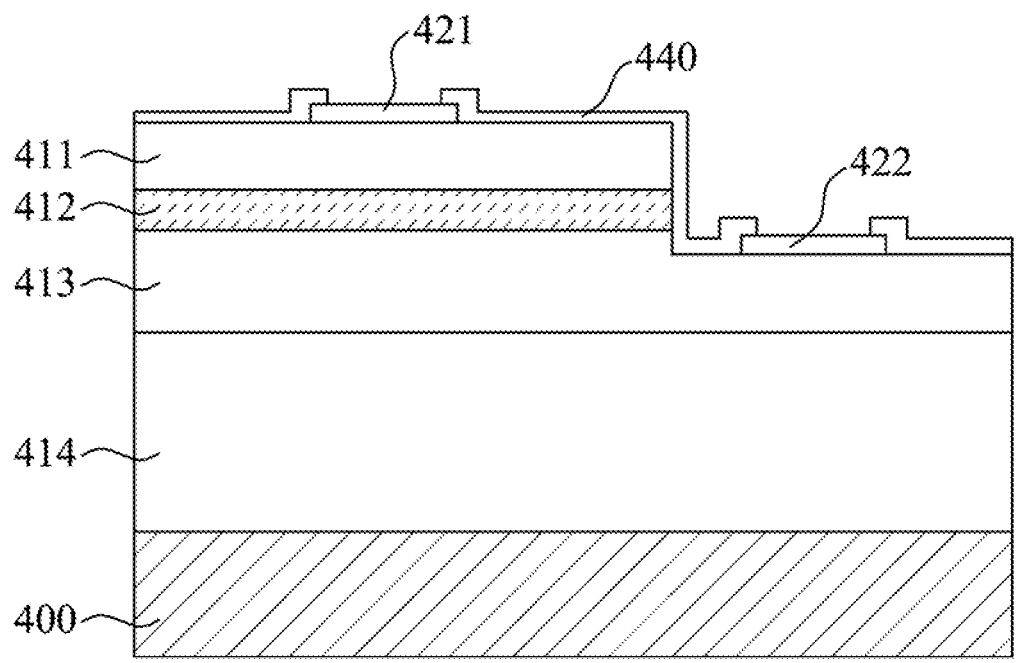

Referring to FIG. 9, a protective insulation layer 440 is formed partially over the epitaxial structure opposite to the growth substrate 400, so that the first and second electrodes 421, 422 are partially exposed. The protective insulation layer 440 may be made from silicon oxide, silicon nitride, aluminum oxide, or so forth. The protective insulation layer 440 may have a thickness of not less than 1 μm.

Figure 10:
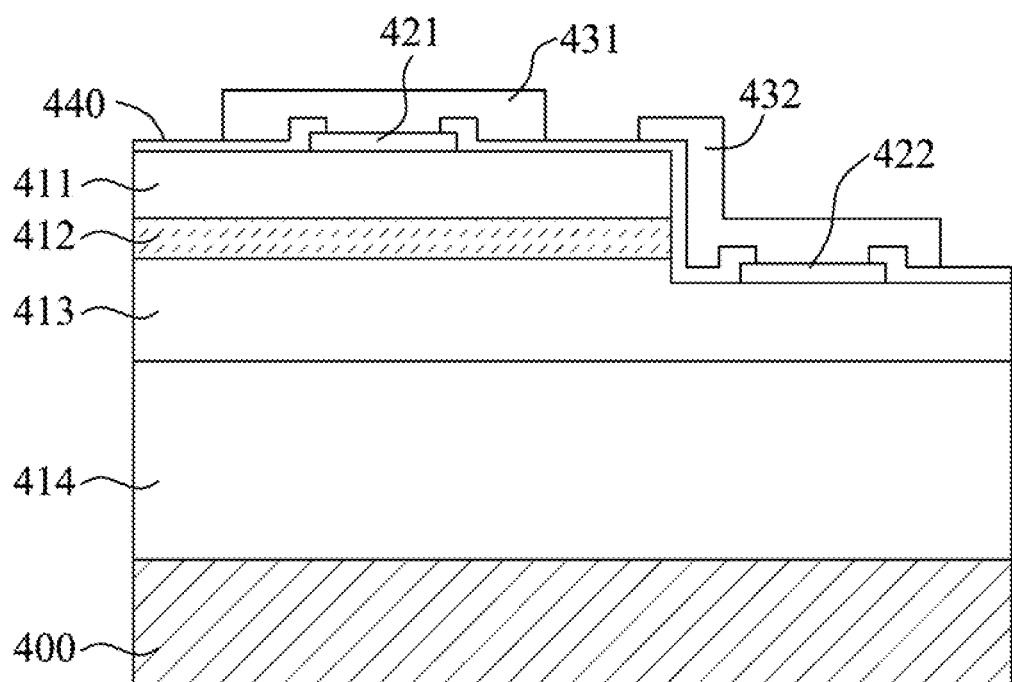

Referring to FIG. 10, a first metallic layer 431 is formed over the first electrode 421 and partially over the protective insulation layer 440, so that the first electrode 421 is totally unexposed. Likewise, a second metallic layer 432 is formed over the second electrode 422 and partially over the protective insulation layer 440, so that the second electrode 422 is totally unexposed. The first and second metallic layers 431, 432 serve as extended electrodes respectively for the first and second electrodes 421, 422. In addition, the first and second metallic layers 431, 432 may also serve as reflective mirrors. The first and second metallic layers 431, 432 may be made from a metallic material such as titanium, platinum, aluminum, gold, silver, copper, etc.

It should be noted that even though the second electrode 422 is formed on the exposed surface A of the second-type semiconductor layer 413 in this embodiment, the second electrode 422 may be provided in a different manner in other embodiment. For example, instead of forming the larger exposed surface A of the second-type semiconductor layer 413 shown in FIG. 7, one recess (or more) may be formed to extend through the first-type semiconductor layer 411 and the active layer 422, so that a smaller surface of the second-type semiconductor layer 413 is exposed. Therefore, an electrically conductive pillar, which serves to be connected with the second electrode 422 provided outside the recess, may be formed in the recess and extend outwardly of the recess to outreach the first-type semiconductor layer 411. In such case, the second electrode 422 may be provided to be flush with the first electrode 421, or may be provided outside the epitaxial structure.

Figure 11:
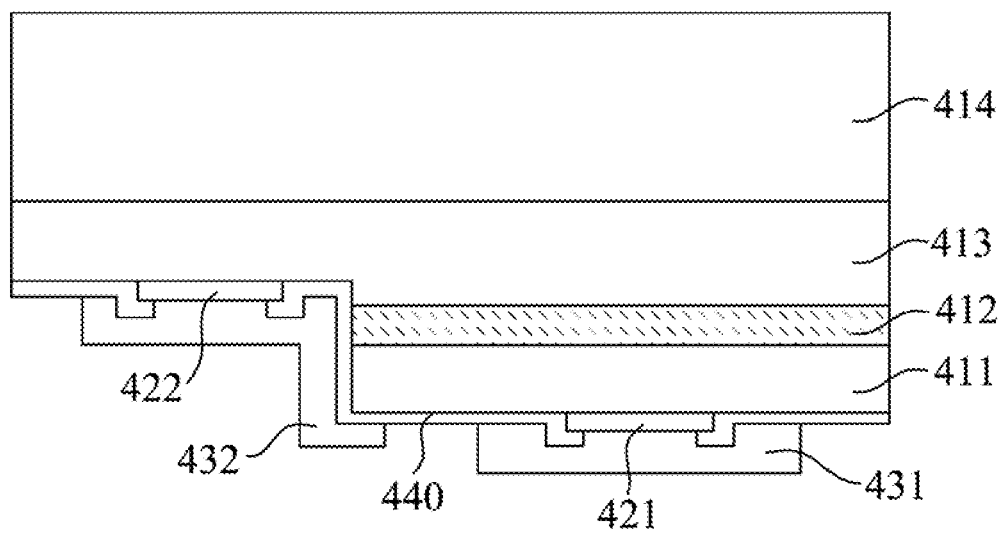

In step S3, as shown in FIG. 11, the growth substrate 400 is removed to expose a surface of the AlGaAs-based semiconductor layer 414. After such removal, the AlGaAs-based semiconductor layer 414 can support thereon the rest of the epitaxial structure (i.e. the second-type semiconductor layer 413, the active layer 412, and the first-type semiconductor layer 411) for achieving physical stability, and a first embodiment of the flip-chip light emitting device according to the present disclosure is obtained. During the removal of the growth substrate 400, the AlGaAs-based semiconductor layer 414 can be used to support the growth substrate 400.

The removal of the growth substrate 400 can be conducted using various methods depending on the material of the growth substrate 400. Exemplary suitable methods include, but are not limited to, laser lift-off (LLO), grinding, and etching. Since the growth substrate 400 is made from GaAs in this embodiment, etching or grinding may be applied to conduct the removal of the growth substrate 400. Considering etching, selective etching with an etch stop layer may be applied to control and stop etching.

A second embodiment of the flip-chip light emitting device and the production method thereof is generally similar to the first embodiment. In particular, the layers and their sublayers (if any) of the epitaxial structure and the growth substrate 400 in the second embodiment are generally similar to those shown in Table 1. However, the differences between the second and first embodiments are described below.

In the second embodiment, the second-type semiconductor layer 413 does not have the n-type ohmic contact sublayer, and the n-type window sublayer of the second-type semiconductor layer 413, in addition to its current spreading function, serves to be in ohmic contact with the second electrode 422. Besides, the n-type window sublayer has a thickness ranging from 20 nm to 6000 nm.

Since the n-type window sublayer serves as an ohmic contact sublayer, in step S2, the second-type semiconductor layer 413 is only required to be etched (e.g. through drying etching) to partially expose the n-type window sublayer, so that the n-type window sublayer has the exposed surface A (for the second electrode 422 to be formed thereon). Therefore, the simplification of the etching process may improve the production yield. In addition, in the second embodiment, the omission of the n-type ohmic contact sublayer shown in Table 1 can improve the light emitting efficiency since light can pass through the epitaxial structure more easily.

After formation of the second electrode 422 on the n-type window sublayer, high-temperature annealing may be conducted at, for example, a temperature of not less than 300° C., so that the metal atoms in the second electrode 422 diffuses into the n-type window sublayer for the second electrode 422 and the n-type window sublayer to be in ohmic contact.

The second electrode 422 may be made from a material selected from the group consisting of gold, germanium, nickel, and combinations thereof (e.g. alloys thereof). Examples of the aforesaid combinations include, but are not limited to, AuGe, AuGeNi, Au/AuGe/Ni/Au, and Au/AuGeNi/Au. In addition, the second electrode 422 may have a multi-layered structure, and may have a layer that is in contact with the n-type window sublayer, that may be made from Au or an Au-containing alloy, and that may have a thickness ranging from 1 nm to 50 nm (e.g. 5 to 20 nm).

Regarding the $Al_cGa_{1-c}InP$ material of the n-type window sublayer, c may range from 0.5 to 1, so that the undesired light absorption of the n-type window sublayer can be reduced. Further, in order to achieve better lattice matching between the aluminum gallium indium phosphide material and the material (e.g. gallium arsenide) of the growth substrate 400 for accomplishing more satisfactory crystal growth of the aluminum gallium indium phosphide material, c may range from 0.6 to 0.8.

For achieving better horizontal current spreading, the thickness of the n-type window sublayer may range from 2.5 μm to 3.5 μm (i.e. 2500 nm to 3500 nm).

Based on the desired ohmic contact effect and current spreading effect, the n-type window sublayer may have a doping concentration of not less than $1 \times 10^{18}$ atoms/cm$^3$ (e.g., $1 \times 10^{18}$ atoms/cm$^3$ to $2 \times 10^{18}$ atoms/cm$^3$). A lower doping concentration may lead to a higher ohmic contact resistance. A higher doping concentration may lead to light absorption and hence reduce the light emitting efficiency. The doping concentration of the n-type window sublayer in the thickness direction of the n-type window sublayer may be uniform or not. In the case of non-uniformity, the doping concentration of the n-type window sublayer may vary in the thickness direction of the n-type window sublayer. Namely, the closer to the second electrode 422, the higher the doping concentration of the n-type window sublayer can be for improving the ohmic contact.

The second embodiment of the flip-chip light emitting device is suitable to have a small size. For instance, the epitaxial structure of the flip-chip light emitting device may have a size of not greater than 300 μm×300 μm, so that the flip-chip light emitting device can be a mini flip-chip light emitting device. Alternatively, the flip-chip light emitting device may be a micro flip-chip light emitting device.

A third embodiment of the flip-chip light emitting device and the production method thereof is generally similar to the first embodiment. In particular, the layers and their sublayers (if any) of the epitaxial structure and the growth substrate 400 in the third embodiment are generally similar to those shown in Table 1. However, the differences between the third and first embodiments are described as follows.

The n-type window sublayer of the second-type semiconductor layer 413 is made from $Al_dGa_{1-d}As$ instead. Regarding such $Al_dGa_{1-d}As$ material, d may range from 0.45 to 0.65 (e.g. d may be 0.5). Compared to the AlGaInP-based window sublayer, the limit of the growth rate of the AlGaAs-based window sublayer can be increased from 7 Å/S to 40 Å/S (namely, the growth rate can be enhanced by at least threefold). Thus, the growth time of the epitaxial structure can be reduced by at least 30%. Since the production time can be greatly reduced, the production cost can be lowered as well, facilitating mass production. Besides, due to the higher growth temperature window (680±30° C.) of the $Al_dGa_{1-d}As$ material, the growth of the epitaxial structure can be more easily controlled.

A fourth embodiment of the flip-chip light emitting device and the production method thereof is generally similar to the first embodiment. In particular, the layers and their sublayers (if any) of the epitaxial structure and the growth substrate 400 in the fourth embodiment are generally similar to those shown in Table 1. However, the differences between the fourth and first embodiments are described below.

In the fourth embodiment, the second-type semiconductor layer 413 does not have the n-type window sublayer.

Moreover, the fourth embodiment of the flip-chip light emitting device is suitable to have a small size. For instance, the epitaxial structure of the flip-chip light emitting device may have a size of not larger than 300 µm×300 µm, so that the flip-chip light emitting device can be a mini flip-chip light emitting device. Alternatively, the flip-chip light emitting device may be a micro flip-chip light emitting device.

A fifth embodiment of the flip-chip light emitting device and the production method thereof is generally similar to the first embodiment. In particular, the layers and their sublayers (if any) of the epitaxial structure and the growth substrate 400 in the fifth embodiment are generally similar to those shown in Table 1. However, the differences between the fifth and first embodiments are described as follows.

The AlGaAs-based semiconductor layer 414 is n-type doped, and has a thickness ranging from 30 µm to 100 µm.

Figure 12:
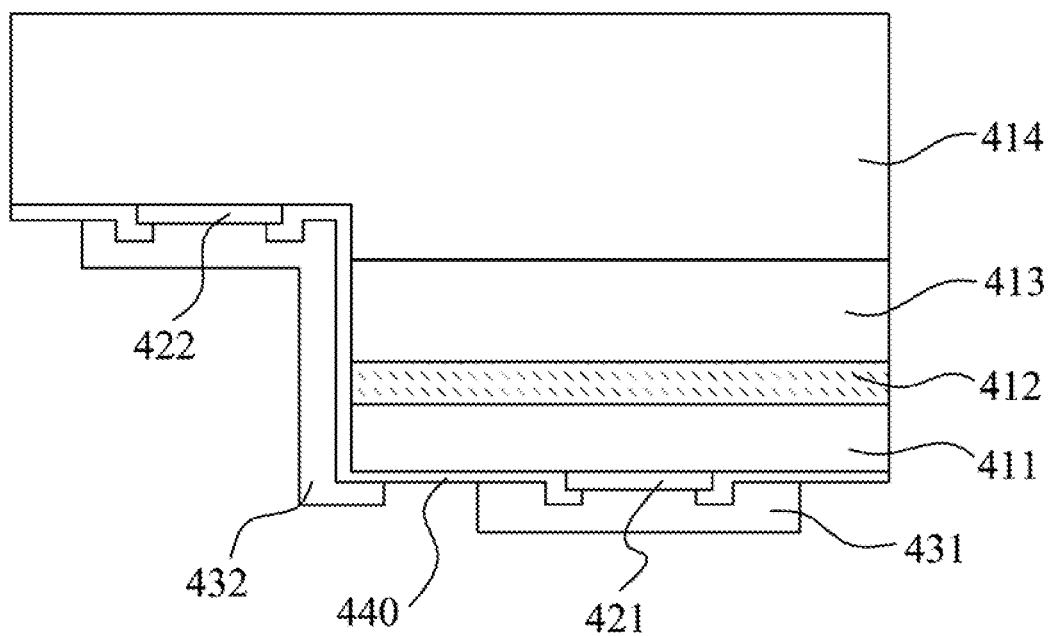
FIG. 12 is a schematic sectional view illustrating a flip-chip light emitting device produced using a fifth embodiment of the method.

Furthermore, referring to FIG. 12, the second electrode 422 is formed on the AlGaAs-based semiconductor layer 414 instead. In other words, in step S2, the first-type semiconductor layer 411, the active layer 412, the second-type semiconductor layer 413, and the AlGaAs-based semiconductor layer 414 are partially etched, so that the AlGaAs-based semiconductor layer 414 is partially exposed to have the exposed surface A for the second electrode 422 to be formed thereon. Therefore, the AlGaAs-based semiconductor layer 414 serves to be in ohmic contact with the second electrode 422, and the second-type semiconductor layer 413 does not have the n-type window sublayer and the n-type ohmic contact sublayer.

Accordingly, the fifth embodiment of the flip-chip light emitting device is suitable to have a small size. For instance, the epitaxial structure of the flip-chip light emitting device may have a size of not larger than 300 µm×300 µm, so that the flip-chip light emitting device can be a mini flip-chip light emitting device. Alternatively, the flip-chip light emitting device may be a micro flip-chip light emitting device.

A sixth embodiment of the flip-chip light emitting device and the production method thereof is generally similar to the first embodiment. In particular, the layers and their sublayers (if any) of the epitaxial structure and the growth substrate 400 in the sixth embodiment are generally similar to those shown in Table 1. However, the differences between the fifth and first embodiments are described as follows.

The first-type semiconductor layer 411 is an n-type semiconductor layer instead, and the second-type semiconductor layer 413 is a p-type semiconductor layer instead. Specifically, the window sublayer, the cladding sublayer, and the barrier sublayer of the first-type semiconductor layer 411 are of n-type instead, and hence such n-type cladding sublayer (made from AlInP+Si) and such n-type barrier sublayer respectively function to provide electrons and block entry of Si into the active layer 412 for securing performance. Likewise, the window sublayer, the cladding sublayer, and the barrier sublayer of the second-type semiconductor layer 413 are of p-type, and hence such p-type cladding sublayer (made from AlInP+Mg) and such p-type barrier sublayer respectively function to provide holes and block entry of Mg into the active layer 412 for securing performance. Due to the aforesaid doping type of the first-type and second-type semiconductor layers 411, 413, the first and second electrodes 421, 422 are of n-type and p-type, respectively.

Furthermore, the first-type semiconductor layer 411 does not have the transition sublayer, and the second-type semiconductor layer 413 does not have the ohmic contact sublayer (thus, the p-type window sublayer of the second-type semiconductor layer 413, in addition to its current spreading function, serves to be in ohmic contact with the second electrode 422). The p-type window sublayer of the second-type semiconductor layer 413 has a thickness ranging from 20 nm to 6000 nm.

Despite above, in a variation of the sixth embodiment, the second-type semiconductor layer 413 may have the ohmic contact sublayer (of p-type in such case), and the ohmic contact sublayer functions to be in ohmic contact with the second electrode 422. In another variation of the sixth embodiment, the second-type semiconductor layer 413 does not have the window sublayer and the ohmic contact sublayer, and the AlGaAs-based semiconductor layer 414 is of p-type and serves to be in ohmic contact with the second electrode 422 like that in the fifth embodiment.

The advantages of the flip-chip light emitting device and the production method thereof according to the present disclosure reside in the following.

First, since the AlGaAs-based semiconductor layer 414 is made from an AlGaAs material (e.g. $Al_xGa_{1-x}As$), the AlGaAs-based semiconductor layer 414 can be grown in a more efficient manner, thereby improving the growth efficiency of the epitaxial structure and reducing the production cost. Moreover, due to its AlGaAs material, the AlGaAs-based semiconductor layer 414 can enhance the performance of the flip-chip light emitting device, and can serve as a satisfactory light exiting layer.

Secondly, the AlGaAs-based semiconductor layer 414 has a thickness of not less than 30 µm, such that the AlGaAs-based semiconductor layer 414 can serve as a support layer for supporting the growth substrate 400 during removal thereof. Therefore, a bonding process is not required for the growth substrate 400 to be removed, improving the production yield of the flip-chip light emitting device.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting device comprising:
an epitaxial structure including a first-type semiconductor layer, an active layer, and a second-type semiconductor layer, said second-type semiconductor layer having a second-type cladding sublayer and a second-type window sublayer, said active layer being made from aluminum gallium indium phosphide (AlGaInP) and disposed on said second-type semiconductor layer, said first-type semiconductor layer being disposed on said active layer opposite to said second-type semiconductor layer, and having a first-type window sublayer and a first-type cladding sublayer that are distal from and proximate to said active layer, respectively;
a first electrode disposed on an electrode placement side of said epitaxial structure, so that said first electrode is electrically connected with said first-type semiconductor layer; and
a second electrode disposed on said electrode placement side of said epitaxial structure, so that said second electrode is electrically connected with said second-type semiconductor layer, said second electrode being in ohmic contact with said second-type window sublayer.

2. The light emitting device as claimed in claim 1, wherein said first-type semiconductor layer is made from a material selected from the group consisting of AlGaAs, AlGaInP, aluminum indium phosphide (AlInP), gallium phosphide (GaP), and combinations thereof.

3. The light emitting device as claimed in claim 1, wherein said second-type semiconductor layer is made from a material selected from the group consisting of AlGaAs, AlGaInP, AlInP, GaP, and combinations thereof.

4. The light emitting device as claimed in claim 1, wherein said second-type cladding sublayer and said second-type window sublayer that are proximate to and distal from said active layer, respectively, said second-type window sublayer being made from a material selected from the group consisting of AlGaAs, AlGaInP, and a combination thereof.

5. The light emitting device as claimed in claim 1, wherein said second electrode is in one of a single-layered form and a multi-layered form, a contact portion of said second electrode in contact with said second-type window sublayer being made from one of gold (Au) and an Au-containing alloy.

6. The light emitting device as claimed in claim 5, wherein said contact portion of said second electrode has a thickness ranging from 5 nm to 20 nm.

7. The light emitting device as claimed in claim 1, wherein said epitaxial structure has a size of not larger than 300 μm×300 μm, said second-type cladding sublayer and said second-type window sublayer that are proximate to and distal from said active layer, respectively.

8. The light emitting device as claimed in claim 1, further comprising a first metallic layer that is disposed over and in contact with said first electrode, and a second metallic layer that is disposed over and in contact with said second electrode, said first and second metallic layers being larger in surface area than said first and second electrodes, respectively.

9. The light emitting device as claimed in claim 8, wherein said first and second metallic layers are reflective layers.

10. The light emitting device as claimed in claim 1, wherein said second-type window sublayer has a doping concentration not less than $1 \times 10^{18}$ atoms/cm$^3$.

11. The light emitting device as claimed in claim 1, wherein said second-type window sublayer has a doping concentration ranging from $1 \times 10^{18}$ atoms/cm$^3$ to $2 \times 10^{18}$ atom s/cm$^3$.

12. The light emitting device as claimed in claim 1, wherein said second-type window sublayer has a doping concentration varying in a thickness direction thereof.

13. The light emitting device as claimed in claim 1, wherein said second-type window sublayer has a thickness ranging from 2.5 μm to 3.5 μm.

14. The light emitting device as claimed in claim 1, wherein some metal atoms in the second electrode diffuses into the second-type window sublayer.

15. A light emitting apparatus comprising at least one light emitting device as claimed in claim 1.

16. The light emitting apparatus as claimed in claim 15, wherein said epitaxial structure of said light emitting device has a size of not larger than 300 μm×300 μm, said second-type cladding sublayer and said second-type window sublayer that are proximate to and distal from said active layer of said epitaxial structure, respectively.

17. The light emitting apparatus as claimed in claim 15, wherein said epitaxial structure of said light emitting device has a size of not larger than 300 μm×300 μm.

18. The light emitting apparatus as claimed in claim 15, wherein said second-type semiconductor layer of said epitaxial structure further includes a second-type barrier sublayer disposed on said second-type cladding sublayer opposite to said second-type window sublayer.

19. The light emitting apparatus as claimed in claim 15, wherein said second-type window sublayer has a doping concentration not less than $1 \times 10^{18}$ atoms/cm$^3$.

* * * * *